United States Patent
Ogata et al.

(10) Patent No.: US 9,387,520 B2
(45) Date of Patent: Jul. 12, 2016

(54) LIQUID PROCESSING APPARATUS AND CLEANING METHOD

(71) Applicant: Tokyo Electron Limited, Tokyo (JP)

(72) Inventors: Nobuhiro Ogata, Kumamoto (JP); Terufumi Wakiyama, Kumamoto (JP); Yoshihiro Kai, Kumamoto (JP); Ryouga Kamo, Kumamoto (JP); Yoshinori Ikeda, Kumamoto (JP)

(73) Assignee: Tokyo Electron Limited, Tokyo (JP)

( * ) Notice: Subject to any disclaimer, the term of this patent is extended or adjusted under 35 U.S.C. 154(b) by 410 days.

(21) Appl. No.: 13/941,770

(22) Filed: Jul. 15, 2013

(65) Prior Publication Data

US 2014/0026927 A1 Jan. 30, 2014

(30) Foreign Application Priority Data

Jul. 26, 2012 (JP) ................... 2012-166106
Mar. 15, 2013 (JP) ................... 2013-053542

(51) Int. Cl.
*H01L 21/67* (2006.01)
*B08B 3/04* (2006.01)

(52) U.S. Cl.
CPC ............ *B08B 3/04* (2013.01); *H01L 21/67051* (2013.01)

(58) Field of Classification Search
CPC ................ B08B 3/04; H01L 21/67023; H01L 21/67028; H01L 21/6704; H01L 21/67051
See application file for complete search history.

(56) References Cited

U.S. PATENT DOCUMENTS 5,688,322 A * 11/1997 Motoda ................... G03F 7/162
 118/319
2007/0119476 A1* 5/2007 Hara ................... H01L 21/6708
 134/1.3

FOREIGN PATENT DOCUMENTS

| JP | 07-185445 A | 7/1995 |
| JP | 2003-282417 A | 10/2003 |
| JP | 2004-050054 A | 2/2004 |
| JP | 2011-254019 A | 12/2011 |
| JP | 2012-129462 A | 7/2012 |

* cited by examiner

*Primary Examiner* — David Cormier
(74) *Attorney, Agent, or Firm* — Abelman, Frayne & Schwab

(57) ABSTRACT

Disclosed are a liquid processing apparatus and a cleaning method which may perform cleaning on a portion which is not in the vicinity of a drain section in an exhaust route. The liquid processing apparatus includes an exhaust section provided in vicinity of the drain section, which is configured to exhaust a surrounding atmosphere of the substrate held by the substrate holding unit; an exhaust route forming member configured to form an exhaust route reaching the exhaust section; and a first cleaning unit configured to supply a cleaning liquid to the exhaust route forming member at the exhaust route side.

10 Claims, 6 Drawing Sheets

LIQUID PROCESSING APPARATUS AND CLEANING METHOD

CROSS-REFERENCE TO RELATED APPLICATIONS

This application is based on and claims priority from Japanese Patent Application Nos. 2013-053542 and 2012-166106 filed on Mar. 15, 2013 and Jul. 26, 2012, with the Japan Patent Office, the disclosures of which are incorporated herein in their entireties by reference.

TECHNICAL FIELD

The present disclosure relates to a liquid processing apparatus configured to process a substrate with a processing liquid, and a cleaning method in the liquid processing apparatus.

BACKGROUND

In a semiconductor product manufacturing process or a flat panel display (FPD) manufacturing process, a process of performing a liquid processing by supplying a processing liquid to a semiconductor wafer or a glass substrate as a substrate to be processed is frequently used. For example, such a process involves a cleaning processing that removes, for example, particles or contaminants attached to the substrate.

As for a liquid processing apparatus that performs such a liquid processing, there is known a single-wafer type liquid processing unit in which, when a substrate such as a semiconductor wafer is held and rotated by a spin chuck, a processing liquid (for example, a chemical liquid or a rinse liquid) is supplied to the front surface or front and rear surfaces of the substrate so as to perform a processing.

The processing liquid supplied to the substrate is shaken off from the rotating substrate, and formed and scattered as mists in an area around a substrate holding unit. Thus, a conventional liquid processing unit is provided with a drain section configured to recover the processing liquid that has been supplied to a substrate. Also, an exhaust section configured to exhaust the atmosphere surrounding the substrate held by the substrate holding unit is provided in the vicinity of the drain section. A liquid processing unit provided with a drain section or an exhaust section is known in the related art. See, e.g., Japanese Patent Application Laid-Open No. 2011-254019.

SUMMARY

The present disclosure provides a liquid processing apparatus including: a substrate holding unit configured to hold a substrate horizontally; a substrate rotating mechanism configured to rotate the substrate holding unit; a processing liquid supply unit configured to supply a processing liquid to the substrate held by the substrate holding unit; a guide cup provided to surround the substrate holding unit; a drain section configured to recover the processing liquid supplied to the substrate; an exhaust section provided in vicinity of the drain section and configured to exhaust the surrounding atmosphere of the substrate held by the substrate holding unit; an exhaust route forming member provided between a first area configured to process the substrate held by the substrate holding unit with the processing liquid and a second area in which the drain section and the exhaust section are provided, a gap being provided between the exhaust route forming member and the guide cup and an exhaust route reaching the exhaust section being formed by the guide cup and the exhaust route forming members; and a first cleaning unit configured to supply a cleaning liquid to the exhaust route forming member at the second area side.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

In the following detailed description, reference is made to the accompanying drawing, which form a part hereof. The illustrative embodiments described in the detailed description, drawing, and claims are not meant to be limiting. Other embodiments may be utilized, and other changes may be made without departing from the spirit or scope of the subject matter presented here.

In the conventional liquid processing unit, the crystals remaining after evaporation of the processing liquid are attached and deposited in an exhaust route reaching the exhaust section. Thus, such crystals are required to be cleaned. Conventionally, when cleaning the remaining crystals attached in the exhaust route, a neighboring portion of the drain section in the exhaust route may be cleaned by supplying a cleaning liquid to the drain section to overflow in the drain section. However, such a method has a problem in that a portion which is not in the vicinity of the drain section in the exhaust route may not be cleaned.

The present disclosure has been made by taking the above-described problems into consideration. An object of the present disclosure is to provide a liquid processing apparatus and a cleaning method which may perform the cleaning of a portion which is not in the vicinity of the drain section in the exhaust route.

An aspect of the present disclosure provides a liquid processing apparatus including: a substrate holding unit configured to hold a substrate horizontally; a substrate rotating mechanism configured to rotate the substrate holding unit; a processing liquid supply unit configured to supply a processing liquid to the substrate held by the substrate holding unit; a guide cup provided to surround the substrate holding unit; a drain section configured to recover the processing liquid supplied to the substrate; an exhaust section provided in vicinity of the drain section and configured to exhaust the surrounding atmosphere of the substrate held by the substrate holding unit; an exhaust route forming member provided between a first area configured to process the substrate held by the substrate holding unit with the processing liquid and a second area in which the drain section and the exhaust section are provided, a gap being provided between the exhaust route forming member and the guide cup and an exhaust route reaching the exhaust section being formed by the guide cup and the exhaust route forming members; and a first cleaning unit configured to supply a cleaning liquid to the exhaust route forming member at the second area side.

In the liquid processing apparatus, the first cleaning unit is a nozzle configured to supply the cleaning liquid in a droplet state.

In the liquid processing apparatus, the first cleaning unit is configured to supply the cleaning liquid to at least a portion of the exhaust route forming member at an inner side than the drain section in a radial direction.

In the liquid processing apparatus, the exhaust route forming member is provided with a guide plate which downwardly extends from the exhaust route forming member, and the first cleaning unit is configured to supply the cleaning liquid to at least a portion at a downstream side of the guide plate in an exhaust direction of the exhaust route.

In the liquid processing apparatus, the first cleaning unit is disposed at an inner side than the drain section in a radial direction.

In the liquid processing apparatus, the first cleaning unit includes a nozzle provided within the second area disposed at an inner side than the drain section in a radial direction and including a plurality of first ejection holes arranged at intervals in a circumferential direction, and each of the first ejection holes ejects the cleaning liquid radially outwards and slantly upwards, toward a bottom surface of the exhaust route forming member.

In the liquid processing apparatus, a guide protrusion protruding toward the drain section is provided at an outer peripheral portion of the bottom surface of the exhaust route forming member, the guide protrusion is configured to guide a liquid included in a gas-liquid multiphase flow that flows down from the first area toward the drain section, and to guide gas included in the gas-liquid multiphase flow to an inner side than the guide protrusion of the exhaust route in a radial direction, and in the bottom surface of the exhaust route forming member, a section extending from a cleaning liquid collision position to the guide protrusion is formed in a slope of which the height decreases toward the radial outside, the cleaning liquid collision position being a position where the cleaning liquid ejected from each of the first ejection holes collides.

In the liquid processing apparatus, the first cleaning unit includes a nozzle provided within the second area which is at an inner side than the drain section in a radial direction and formed with a plurality of second ejection holes arranged at intervals in a circumferential direction, and each of the second ejection holes supplies the cleaning liquid toward a wall body that partitions the drain section.

In the liquid processing apparatus, further including a second cleaning unit configured to supply the cleaning liquid to the exhaust route forming member at the first area side.

In the liquid processing apparatus, the exhaust route forming member at the first area side is formed with a recess, and the cleaning liquid is supplied to a top surface side of the exhaust route forming member by the second cleaning unit.

In the liquid processing apparatus, the exhaust route forming member is provided with a through hole, and the cleaning liquid supplied to the top surface side of the exhaust route forming member is passed through the through hole and sent to the drain section.

In the liquid processing apparatus, the second cleaning unit supplies the cleaning liquid to a portion of the substrate holding unit that faces the exhaust route forming member.

In the liquid processing apparatus, the second cleaning unit includes a plurality of ejection holes provided at different positions in a radial direction of the exhaust route forming member.

In the liquid processing apparatus, the second cleaning unit is disposed at an inner side than the drain section in a radial direction.

Another aspect of the present disclosure provides a cleaning method that is used in a liquid processing apparatus including: a substrate holding unit configured to hold a substrate horizontally; a substrate rotating mechanism configured to rotate the substrate holding unit; a processing liquid supply unit configured to supply a processing liquid to the substrate held by the substrate holding unit; a guide cup provided to surround the substrate holding unit; a drain section configured to recover the processing liquid supplied to the substrate; an exhaust section provided in vicinity of the drain section and configured to exhaust the surrounding atmosphere of the substrate held by the substrate holding unit; and an exhaust route forming member provided between a first area configured to process the substrate held by the substrate holding unit with the processing liquid and a second area in which the drain section and the exhaust section are provided, a gap being provided between the exhaust route forming member and the guide cup and an exhaust route reaching the exhaust section being formed by the guide cup and the exhaust route forming members. The cleaning method includes a first cleaning process in which a cleaning liquid is supplied to the exhaust route forming member at the second area side.

According to the liquid processing apparatus and the cleaning method of the present disclosure, a portion which is not in the vicinity of the drain section in the exhaust route reaching the exhaust section may be cleaned, thereby suppressing the crystals remaining after evaporation of the processing liquid from being attached and deposited in the exhaust route.

Figure 1:
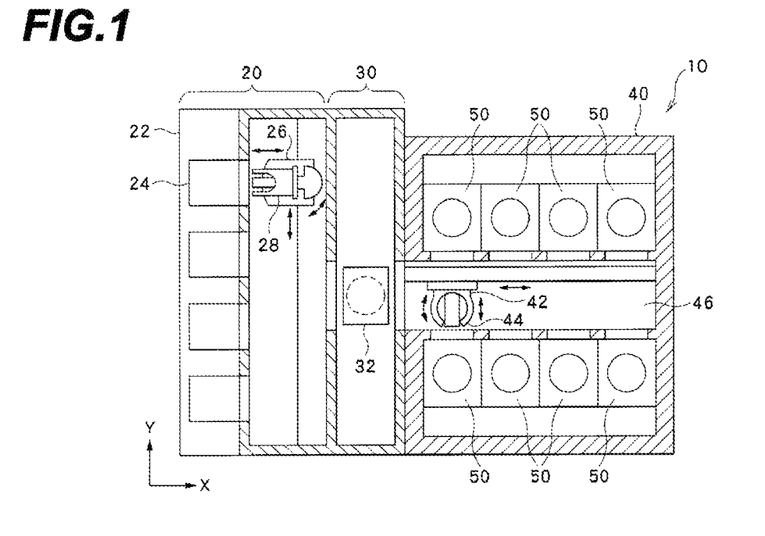
FIG. 1 is a horizontal cross-sectional view illustrating the entire configuration of a liquid processing apparatus according to an exemplary embodiment of the present disclosure.
Figure 2:
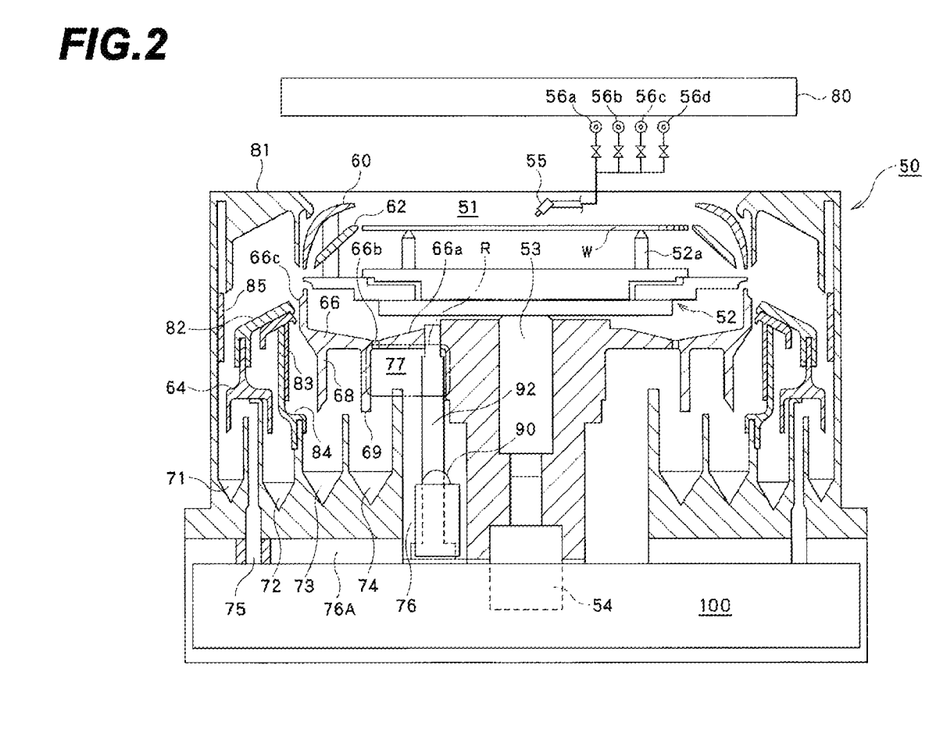
FIG. 2 is a configuration view illustrating the configuration of a liquid processing unit provided in the liquid processing apparatus illustrated in FIG. 1.
Figure 3A:
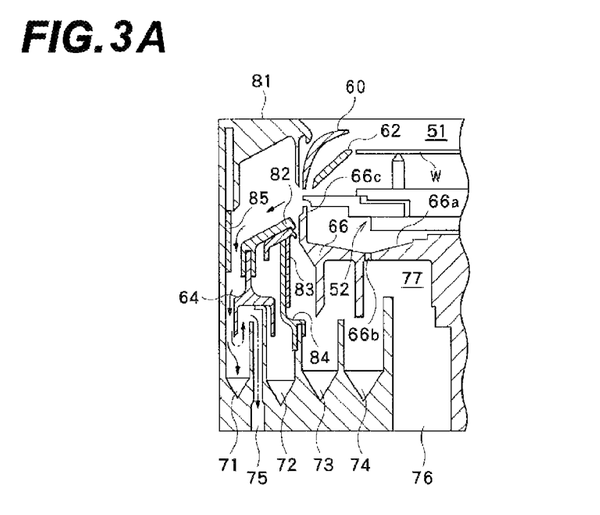
FIGS. 3A to 3C are views illustrating states where a second guide cup and a third guide cup are positioned at lower positions, central positions, and upper positions, respectively, in the liquid processing unit illustrated in FIG. 2.
Figure 3B:
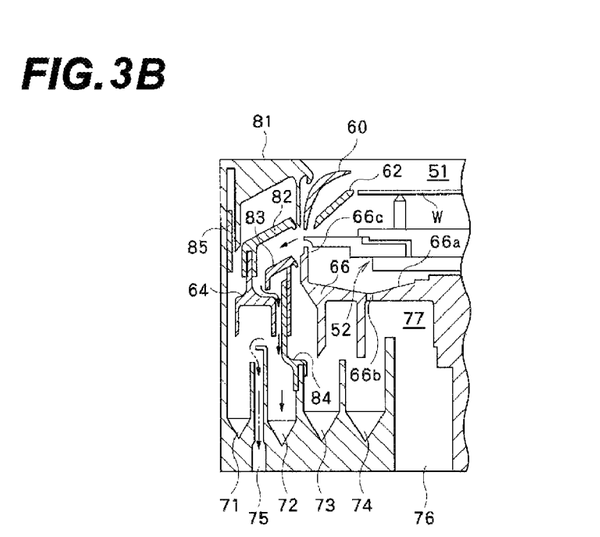
Figure 3C:
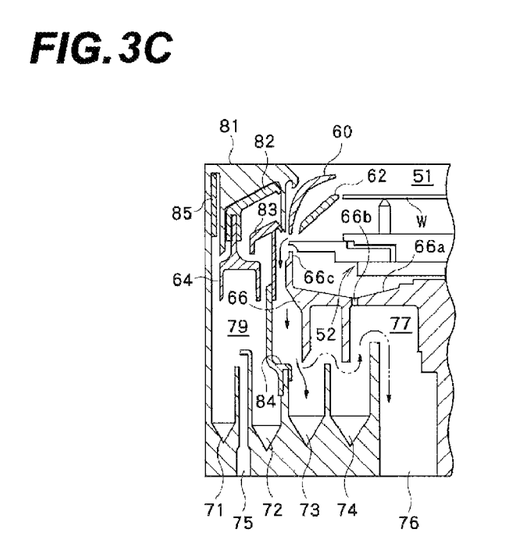

Hereinafter, exemplary embodiments of the present disclosure will be described with reference to the drawings. FIGS. 1 to 3 are views illustrating the configuration of a liquid processing apparatus according to an exemplary embodiment. Among the drawings, FIG. 1 is a horizontal cross-sectional view illustrating the entire configuration of the liquid processing apparatus according to the present exemplary embodiment and FIG. 2 is a configuration view illustrating the configuration of a liquid processing unit provided in the liquid processing apparatus illustrated in FIG. 1. FIGS. 3A to 3C are views illustrating states where a second guide cup and a third guide cup are positioned at lower positions, central positions, and upper positions, respectively, in the liquid processing unit illustrated in FIG. 2.

First, the entire configuration of the liquid processing apparatus according to the present exemplary embodiment will be described with reference to FIG. 1. A liquid processing apparatus 10 illustrated in FIG. 1 supplies a chemical liquid as a processing fluid to a substrate W as an object to be processed (hereinafter, also referred to as a "wafer W") so as to perform a liquid processing that removes particles or contaminants attached on the wafer W. As illustrated in FIG. 1, the liquid processing apparatus 10 according to the present exemplary embodiment includes: a carrier disposition block 20 where carrying-in/carrying-out of a carrier 24 configured to accommodate a plurality of wafers W received from the outside is performed; a delivery block 30 provided with a delivery unit of a wafer W; and a processing block 40 configured to perform a predetermined liquid processing on the wafer W. The carrier disposition block 20, the delivery block 30, and the processing block 40 are arranged in a line in the front and rear direction (X-direction in FIG. 1) in this order from the front side, and connected to each other.

The carrier disposition block 20 includes a carrier disposition section 22 on which, for example, four carriers 24 are disposed, and a first conveyance unit 26 configured to convey a wafer W between the carriers 24 disposed on the carrier disposition section 22 and the delivery block 30. The first conveyance unit 26 is provided with a holding arm 28 configured to hold a wafer W. The holding arm 28 is configured to be moveable back and forth in the front and rear direction, moveable in the left-right direction (Y direction in FIG. 1), rotatable, and moveable in an up and down direction.

The delivery block 30 includes a delivery stage 32 in multi-steps and is configured such that each of the first conveyance unit 26 and a second conveyance unit 42 is accessible to the delivery stage 32. The second conveyance unit 42 is provided in the processing block 40 to be described later.

The processing block 40 includes a conveyance road 46 which extends in the front and rear direction (X-direction in FIG. 1) to convey wafers W along the conveyance road 46. The conveyance road 46 includes the second conveyance unit 42. Also, for example, four liquid processing units 50 are provided at each of left and right sides the conveyance road 46 when viewed from the carrier disposition block 20 side so that the liquid processing units 50 at the left and right sides face each other across the conveyance road 46. The second conveyance unit 42 is configured to perform the delivery of the wafers W in relation to a total of eight liquid processing units 50 and the above described delivery stage 32. The second conveyance unit 42 is provided with a holding arm 44 configured to hold the rear side peripheral edge of a wafer W and to be movable back and forth, rotatable, movable up and down, and movable along the conveyance road 46.

Hereinafter, the detailed configuration of the liquid processing unit 50 will be described with reference to FIGS. 2 and 3. As illustrated in FIG. 2, the liquid processing unit 50 includes: a liquid processing chamber 51 in which a wafer W is carried in/carried out by the holding arm 44 of the second conveyance unit 42 to be processed; and a rotatable substrate holding unit 52 provided within the liquid processing chamber 51 horizontally hold the wafer W. The substrate holding unit 52 is connected to a rotary motor (substrate rotating mechanism) 54 that rotates the substrate holding unit 52, via a rotational driving shaft 53. Also, the substrate holding unit 52 is provided with a plurality of (e.g., three) of chuck pins 52a (only two are illustrated in FIG. 2), and the wafer W is adapted to be disposed on the chuck pins 52a. The wafer W disposed on the chuck pins 52a is held at the peripheral edge of the substrate holding unit 52 by a mechanical chuck (not illustrated), and is rotated within a horizontal plane by driving the rotary motor 54.

As illustrated in FIG. 2, a nozzle (processing liquid supply unit) 55 configured to selectively eject (supply) plural kinds of processing liquids to the wafer W held by the substrate holding unit 52 is provided in the liquid processing chamber 51. That is, the nozzle 55 is connected to each of an acidic processing liquid supply source 56a, an alkaline processing liquid supply source 56b, a cleaning liquid supply source 56c, and an organic processing liquid supply source 56d and an acidic processing liquid, an alkaline processing liquid, a cleaning liquid and an organic processing liquid are selectively sent to the nozzle 55 from these supply sources 56a to 56d to be ejected to the surface of the wafer W. Also, as for the acidic processing liquid, for example, an SPM liquid (a mixed solution of sulfuric acid and hydrogen peroxide), an HF liquid (hydrogen fluoride solution), or SC2 (a mixed solution of hydrochloric acid and hydrogen peroxide) may be used, and as for the alkaline processing liquid, for example, an SC1 liquid (ammonia-hydrogen peroxide mixture) or ammonia water may be used. Also, as for the cleaning liquid, for example, pure water may be used, and as for the organic processing liquid, for example, an IPA liquid (isopropyl alcohol solution) may be used.

As illustrated in FIG. 2, a FFU (fan filter unit) 80 is provided above the liquid processing chamber 51. By the FFU 80, clean air is sent, as a downflow, to the liquid processing chamber 51.

Around the substrate holding unit 52, an outer guide rotating cup 60 and an inner guide rotating cup 62 are provided, respectively, which rotate together with the substrate holding unit 52 and guide the processing liquid scattered from the rotating wafer W or the mists of the processing liquid. The outer guide rotating cup 60 or the inner guide rotating cup 62 includes top and bottom openings and is formed in a ring shape as a whole, in which the diameter of the bottom opening is larger than the diameter of the top opening.

Around the substrate holding unit 52, a first guide cup 81, a second guide cup 82, and a third guide cup 83 are provided in this order from the top so as to receive the processing liquid guided by the outer guide rotating cup 60 or the inner guide rotating cup 62 and to guide the processing liquid downwardly. Also, the organic processing liquid is guided through a route formed inside of the first guide cup 81 and outside of the second guide cup 82. Also, the alkaline processing liquid is guided through a route formed inside of the second guide cup 82 and outside of the third guide cup 83. Also, the acidic processing liquid is guided through a route formed inside of the third guide cup 83 and outside of an exhaust route forming member 66 to be described later. Also, the second guide cup 82 may guide the acidic processing liquid, and the third guide cup 83 may guide the alkaline processing liquid. Also, each of the guide cups 81, 82 and 83 is formed in a ring shape as a whole, and the first guide cup 81 is fixed on the liquid processing chamber 51. Also, the second guide cup 82 is connected to an elevating cylinder (not illustrated) to be movable up and down with respect to the first guide cup 81. More specifically, the second guide cup 82 is configured to move up and down between the lower position as illustrated in FIG. 3A and the upper position as illustrated in FIG. 3C via the central position as illustrated in FIG. 3B.

Also, the third guide cup 83 is configured to be movable in an up and down direction together with the second guide cup 82 in a part of up/down movement of the second guide cup 82. More specifically, the third guide cup 83 is configured to move up and down between the lower position as illustrated in FIG. 3A and the upper position as illustrated in FIG. 3C via the central position as illustrated in FIG. 3B. The lower position and the central position may have the same height.

Also, as illustrated in FIG. 2, at the outer circumferential side of the lower area of the first guide cup 81, the second guide cup 82, and the third guide cup 83, a first processing liquid recovering tank 71 is provided so as to recover the organic processing liquid guided through the route formed inside of the first guide cup 81 and outside of the second guide cup 82. At the inner circumferential side of the first processing liquid recovering tank 71, a second processing liquid recovering tank 72 is provided so as to recover the alkaline processing liquid guided through the route formed inside of the second guide cup 82 and outside of the third guide cup 83. At the inner circumferential side of the second processing liquid recovering tank 72, a third processing liquid recovering tank 73 is provided so as to recover the acidic processing liquid guided through the route formed inside of the third guide cup 83 and outside of the exhaust route forming member 66 to be described later. Also, at the inside of the third processing liquid recovering tank 73, a fourth processing liquid recovering tank 74 is provided so as to recover respective processing liquids in a mixed state received from the exhaust route forming member 66 to be described later. Herein, all the first to fourth processing liquid recovering tanks 71 to 74 may be referred to as a drain section in unison.

Also, between the first processing liquid recovering tank 71 and the second processing liquid recovering tank 72, a first exhaust section 75 is provided so as to discharge the surrounding atmosphere of the wafer W through the first guide cup 81 and the second guide cup 82. The first exhaust section 75 may have a ring-shaped planar section, and is formed concentrically together with the respective processing liquid recovering tanks 71 to 74. Also, at the inner circumferential side of the fourth processing liquid recovering tank 74, a second exhaust section 76 is provided so as to discharge the surrounding atmosphere of the wafer W through the third guide cup 83. Here, the surrounding atmosphere of the wafer W is adapted to reach the second exhaust section 76 through an exhaust route 77. An exhaust duct 100 is provided below the first exhaust section 75 and the second exhaust section 76, and exhaust gases from the first exhaust section 75 or the second exhaust section 76 join in the exhaust duct 100 to be discharged from the exhaust duct 100. By the exhaust duct 100, the joined exhaust gases may be individually separated again into an acidic atmosphere, an alkaline atmosphere, and an organic atmosphere, and then discharged to a factory.

Also, as illustrated in FIG. 2, at the lower portion of the second guide cup 82, a guide member 64 is provided so as to guide the processing liquid from the first guide cup 81 to the first processing liquid recovering tank 71, and to guide the processing liquid from the second guide cup 82 to the second processing liquid recovering tank 72. The guide member 64 is formed in a ring shape as a whole so as to cover the upper portion of the first exhaust section 75, and has a U-shaped cross-section that is opened toward the first exhaust section 75. The guide member 64 may be configured to move up and down by being interlocked with the second guide cup 82.

Also, a partition wall 84 is provided to upwardly extend between the second processing liquid recovering tank 72 and the third processing liquid recovering tank 73. The partition wall 84 is configured to partition a flow path (see FIG. 3B) from the second guide cup 82 to the second processing liquid recovering tank 72, and a flow path (see FIG. 3C) from the third guide cup 83 to the third processing liquid recovering tank 73 from each other. The partition wall 84 suppresses the acidic atmosphere and the alkaline atmosphere from being mixed with each other. Thus, the acidic atmosphere and the alkaline atmosphere may not be mixed with each other to be crystallized and it becomes unnecessary to perform cleaning.

Also, as illustrated in FIG. 2, the exhaust route forming member 66 is provided below the substrate holding unit 52. The exhaust route forming member 66 is configured to isolate the liquid processing chamber 51 (first area) that is an area around the wafer W held by the substrate holding unit 52, from the exhaust route 77 (second area) that is an area where the third processing liquid recovering tank 73, the fourth processing liquid recovering tank 74 and the second exhaust section 76 are provided. Since the exhaust route forming member 66 isolates the liquid processing chamber 51 from the exhaust route 77, the wafer W may be processed under an environment with higher purity. Here, the exhaust route forming member 66 is provided with a first guide plate 68 and a second guide plate 69 which extend downwardly from the exhaust route forming member 66 toward the third processing liquid recovering tank 73 and the fourth processing liquid recovering tank 74, respectively. The first guide plate 68 and the second guide plate 69 may guide an exhaust gas toward the exhaust route 77, and also guide a drain liquid toward the third processing liquid recovering tank 73 or the fourth processing liquid recovering tank 74. Also, a recess 66a is formed at a portion of the exhaust route forming member 66 that faces the liquid processing chamber 51 (that is, the top surface side of the exhaust route forming member 66), and a cleaning liquid is supplied to the top surface side of the exhaust route forming member 66 by a second cleaning unit 92 to be described later.

Also, a through hole 66b is formed in the exhaust route forming member 66 so that the cleaning liquid supplied to the top surface side of the exhaust route forming member 66 is sent to the fourth processing liquid recovering tank 74 through the through hole 66b. Also, as illustrated in FIG. 2, the exhaust route forming member 66 is provided with a ring member 66c at the outer circumferential edge thereof, in which the ring member 66c extends upwardly. When the second guide cup 82 is positioned at the upper position as illustrated in FIG. 3C, an exhaust path is formed between the ring member 66c and the third guide cup 83. When the second guide cup 82 is positioned at the upper position as illustrated in FIG. 3C, a third area 79 is formed at the outside of the partition wall 84.

In the present exemplary embodiment, as illustrated in FIG. 2, a first cleaning unit 90 and the second cleaning unit 92 are provided in the vicinity of the second exhaust section 76, respectively. The first cleaning unit 90 and the second cleaning unit 92 are disposed at an inner side than the fourth processing liquid recovering tank 74 in a radial direction.

The first cleaning unit 90 includes a nozzle configured to spray the cleaning liquid upward. The first cleaning unit 90 is configured to supply the cleaning liquid to the exhaust route forming member 66 at the exhaust route 77 (second area) side so as to clean the corresponding portion. More specifically, the first cleaning unit 90 is configured to supply the cleaning liquid to the portion of the exhaust route forming member 66 at an inner side (inner circumferential side) than the fourth processing liquid recovering tank 74 in a radial direction so as to clean the corresponding portion. That is, the first cleaning unit 90 is configured to supply the cleaning liquid to the portion at the downstream side of the second guide plate 69 in the exhaust direction of the exhaust route 77 (see the arrow of two-dot chain line in FIG. 3C) so as to clean the corresponding portion. For example, three first cleaning units 90 may be provided in one liquid processing unit 50 at regular intervals along the circumferential direction of the substrate holding unit 52. Also, since the nozzle sprays the cleaning liquid as droplets in the shape of, for example, a wide-angle fan, a wide range may be cleaned. Also, since the cleaning liquid is sprayed as droplets, a wider range may be cleaned via stream of an exhaust gas.

Also, the second cleaning unit 92 includes an elongated nozzle. The second cleaning unit 92 is configured to supply the cleaning liquid to the exhaust route forming member 66 at the liquid processing chamber 51 (first area) side so as to clean the corresponding portion. More specifically, the second cleaning unit 92 is configured to supply the cleaning liquid to the top surface side of the exhaust route forming member 66. Then, the cleaning liquid supplied to the top surface side of the exhaust route forming member 66 is sent to the fourth processing liquid recovering tank 74 via the through hole 66b. Also, since the second cleaning unit 92 is configured to spray the cleaning liquid upwardly from its top portion, the cleaning liquid is also supplied to the portion of the substrate holding unit 52 that faces the exhaust route forming member 66, by the second cleaning unit 92. For example, one second cleaning unit 92 as described above may be provided in one liquid processing unit 50.

Hereinafter, a liquid processing method of a wafer W by the liquid processing unit 50 including the above configuration will be described.

First, the wafer W is carried into the liquid processing chamber 51 of the liquid processing unit 50 by the holding arm 44 of the second conveyance unit 42, and held by the substrate holding unit 52.

Then, the substrate holding unit 52 that holds the wafer W is rotationally driven together with the outer guide rotating cup 60 or the inner guide rotating cup 62 by the rotary motor 54. Thus, the wafer W held by the substrate holding unit 52 is rotated within a horizontal plane.

Then, the wafer W is processed by an acidic processing liquid. In this case, the acidic processing liquid is supplied to the nozzle 55 from the acidic processing liquid supply source 56a, and ejected to the surface of the rotating wafer W. In such a case, as illustrated in FIG. 3C, the second guide cup 82 and the third guide cup 83 are positioned at the upper positions thereof, respectively. Accordingly, the acidic processing liquid including mists, which is scattered from the wafer W and guided by the outer guide rotating cup 60 or the inner guide rotating cup 62, is guided along a space between the third guide cup 83 and the outer peripheral wall of the exhaust route forming member 66, sent to the third processing liquid recovering tank 73 via the inner circumferential side of the partition wall 84, and recovered (see the arrow of solid line in FIG. 3C). Also, the surrounding atmosphere of the wafer W passes through the exhaust route 77, and then the surrounding atmosphere is discharged via the second exhaust section 76 and sent to the exhaust duct 100 (see the arrow of two-dot chain line in FIG. 3C). Here, the third guide cup 83 and the partition wall 84 isolate the exhaust route 77 (second area) from the third area 79 (the area formed outside of the partition wall 84). Therefore, the atmosphere does not flow from the exhaust route 77 (second area) to the third area 79.

After the processing of the wafer W with the acidic processing liquid is completed, the wafer W is subjected to a rinse processing. In this case, the cleaning liquid is supplied from the cleaning liquid supply source 56c to the nozzle 55, and ejected to the surface of the rotating wafer W. In the meantime, the cleaning liquid scattered from the wafer W is recovered by the third processing liquid recovering tank 73, and the surrounding atmosphere of the wafer W is discharged by the second exhaust section 76.

Then the second guide cup 82 and the third guide cup 83 are moved down from the upper position as illustrated in FIG. 3C to the central position as illustrated in FIG. 3B by the elevating cylinder (not illustrated). Here, the guide member 64 is also moved to the central position as illustrated in FIG. 3B by interlocking the second guide cup 82. Then, the wafer W is processed with the alkaline processing liquid. In this case, the alkaline processing liquid is supplied from the alkaline processing liquid supply source 56b to the nozzle 55, and ejected to the surface of the rotating wafer W. As described above, the second guide cup 82 and the third guide cup 83 are positioned at the central positions thereof, respectively, as illustrated in FIG. 3B. Thus, the alkaline processing liquid including mists, which is scattered from the wafer W and guided by the outer guide rotating cup 60 or the inner guide rotating cup 62, is guided along a space between the second guide cup 82 and the third guide cup 83 and through a space between the guide member 64 and the partition wall 84, and sent to and recovered in the second processing liquid recovering tank 72 (see the arrow of solid line in FIG. 3B). Also, the surrounding atmosphere of the wafer W is discharged by the first exhaust section 75 and sent to the exhaust duct 100 (see the arrow of two-dot chain line in FIG. 3B).

After the processing of the wafer W with the alkaline processing liquid is completed, the wafer W is subjected to a rinse processing. In this case, the cleaning liquid is supplied from the cleaning liquid supply source 56c to the nozzle 55 and ejected to the surface of the rotating wafer W. In the meantime, the cleaning liquid scattered from the wafer W is recovered by the second processing liquid recovering tank 72 in the same manner as for the alkaline processing liquid, and the surrounding atmosphere of the wafer W is discharged by the first exhaust section 75.

Then, the second guide cup 82 and the third guide cup 83 is further moved down from the central positions as illustrated in FIG. 3B to the lower positions as illustrated in FIG. 3B by the elevating cylinder (not illustrated). Here, the guide member 64 is also moved to the lower position as illustrated in FIG. 3A integrally with the second guide cup 82. Then, the wafer W is subjected to a drying processing by the organic processing liquid. In this case, the organic processing liquid is supplied from the organic processing liquid supply source 56d to the nozzle 55, and ejected to the surface of the rotating wafer W. As described above, since the second guide cup 82 and the third guide cup 83 are positioned at the lower positions thereof, respectively, as illustrated in FIG. 3A, the organic processing liquid which is scattered from the wafer W and guided by the outer guide rotating cup 60 or the inner guide rotating cup 62 is guided along a space between the first guide cup 81 and the second guide cup 82 and through the outer circumferential side of the guide member 64 and sent to and recovered in the first processing liquid recovering tank 71 (see the arrow of solid line in FIG. 3A). Also, the surrounding atmosphere of the wafer W is guided in the same manner as for the alkaline processing liquid, discharged by the first exhaust section 75, and sent to the exhaust duct 100 (see the arrow of two-dot chain line in FIG. 3A).

In this manner, the processing of the wafer W is completed. Then, the wafer W is removed from the substrate holding unit 52 by the holding arm 44 of the second conveyance unit 42, and carried out from the liquid processing chamber 51 of the liquid processing unit 50.

Hereinafter, descriptions will be made on a method of cleaning the exhaust route 77 reaching the second exhaust section 76 in the liquid processing unit 50 as illustrated in, for example, FIG. 2. Also, the timing of cleaning the exhaust route 77 is between lots or after processing a predetermined number of wafers W. Alternatively, the exhaust route 77 may be cleaned during the processing of the wafer W. When the liquid processing of the wafer W is performed for a long period of time by the liquid processing unit 50, the crystals of the processing liquids are attached and deposited on the exhaust route forming member 66 of the exhaust route 77 (second area) side. Thus, it is required to clean such a portion so as to remove the crystals. The crystals may include BHF (buffered hydrofluoric acid) (a salt produced by reaction of an acid component and an alkaline component). In the exhaust route 77, all chemical liquids are introduced from the through hole 66b, and thus may be easily reacted and crystallized on the exhaust route forming member 66 at the exhaust route 77 (second area) side. Thus, it is required to clean the exhaust route forming member 66 at the exhaust route 77 (second area) side.

When cleaning the exhaust route 77 reaching the second exhaust section 76, the cleaning liquid is supplied to the third processing liquid recovering tank 73 or the fourth processing liquid recovering tank 74 from the nozzle 55 to overflow from the third processing liquid recovering tank 73 or the fourth processing liquid recovering tank 74, thereby removing the crystals attached and deposited on the portion of the exhaust route 77 in the vicinity of the third processing liquid recovering tank 73 or the fourth processing liquid recovering tank 74. Here, the cleaning liquid is sprayed upwardly by the first cleaning unit 90. Accordingly, the cleaning liquid is supplied to a portion surrounded by the two-dot chain line R in FIG. 2. In this manner, the cleaning liquid may be supplied to the portion of the exhaust route forming member 66 that faces the exhaust route 77 (second area), thereby cleaning the corresponding portion. More specifically, the cleaning liquid is supplied to a portion of the exhaust route forming member 66 at an inner side (inner circumferential side) than the fourth processing liquid recovering tank 74 in a radial direction, thereby cleaning the corresponding portion. That is, the cleaning liquid is supplied to a portion at the downstream side of the second guide plate 69 in the exhaust direction (see the arrow of two-dot chain line in FIG. 3C) of the exhaust route 77, thereby cleaning the corresponding portion.

Also, the cleaning of the exhaust route forming member 66 at the liquid processing chamber 51 (first area) side may be performed by the second cleaning unit 92. Specifically, the cleaning of the recess 66a is performed by supplying the cleaning liquid to the top surface side of the exhaust route forming member 66 by the second cleaning unit 92. Since all the chemical liquids of acidic, alkaline, and organic chemical liquids are introduced into the exhaust route forming member 66 at the liquid processing chamber 51 (first area) side, the chemical liquids may be easily reacted to be crystallized. Thus, it is required to clean the exhaust route forming member 66 at the liquid processing chamber 51 (first area) side. Also, the cleaning liquid supplied to the top surface side of the exhaust route forming member 66 is sent to the fourth processing liquid recovering tank 74 through the through hole 66b. Also, since the second cleaning unit 92 is configured to spray the cleaning liquid upwardly from its top portion, the cleaning liquid is also supplied to the portion of the substrate holding unit 52 that faces the exhaust route forming member 66, by the second cleaning unit 92. Thus, the cleaning of the portion of the substrate holding unit 52 that faces the exhaust route forming member 66 may be performed.

As described above, according to the liquid processing apparatus 10 or the cleaning method of the present exemplary embodiment, the cleaning liquid is adapted to be supplied to the exhaust route forming member 66 at the exhaust route 77 (second area) side by the first cleaning unit 90. Thus, the cleaning may be performed for a portion (specifically, for example, the portion surrounded by the two-dot chain line R in FIG. 2) which is not in the vicinity of the third processing liquid recovering tank 73 or the fourth processing liquid recovering tank 74 in the exhaust route 77 and could not have been cleaned only by supplying the cleaning liquid to the third processing liquid recovering tank 73 or the fourth processing liquid recovering tank 74 to overflow from the third processing liquid recovering tank 73 or the fourth processing liquid recovering tank 74.

Also, in the liquid processing apparatus 10 or the cleaning method of the present exemplary embodiment, the first cleaning unit 90 is configured to supply the cleaning liquid to at least a portion of the exhaust route forming member 66 at an inner side than the fourth processing liquid recovering tank 74 in a radial direction, thereby cleaning the corresponding portion. That is, the first cleaning unit 90 is configured to supply the cleaning liquid to at least a portion at the downstream side of the second guide plate 69 in the exhaust direction of the exhaust route 77, thereby cleaning the corresponding portion.

Also, in the liquid processing apparatus 10 of the present exemplary embodiment, the first cleaning unit 90 is a nozzle that supplies the cleaning liquid in a droplet state. Also, the first cleaning unit 90 is disposed at a portion at an inner side than the fourth processing liquid recovering tank 74 in a radial direction.

Also, in the liquid processing apparatus 10 or the cleaning method of the present exemplary embodiment, the cleaning liquid is supplied to the exhaust route forming member 66 at the liquid processing chamber 51 (first area) side by the second cleaning unit 92. Thus, the crystals of the processing liquid, which are attached on the portion of the exhaust route forming member 66 that faces the liquid processing chamber 51, may be removed.

Here, in the exhaust route forming member 66 at the liquid processing chamber 51 side, the recess 66a is formed, and the cleaning liquid is adapted to be supplied to the top surface side of the exhaust route forming member 66 by the second cleaning unit 92. Also, in the exhaust route forming member 66, the through hole 66b is formed so that the cleaning liquid supplied to the top surface side of the exhaust route forming member 66 is sent to the fourth processing liquid recovering tank 74 through the through hole 66b.

Also, the cleaning liquid is adapted to be supplied to the portion of the substrate holding unit 52 that faces the exhaust route forming member 66 by the second cleaning unit 92. Thus, the crystals of the processing liquid which are attached on the portion of the substrate holding unit 52 that faces the exhaust route forming member 66 may be removed.

Also, as illustrated in FIG. 2, the second cleaning unit 92 is disposed at a portion at an inner side than the fourth processing liquid recovering tank 74 in a radial direction.

Also, in the present exemplary embodiment, the liquid processing apparatus and the cleaning method are not limited to the above described aspect and various changes may be made thereto.

For example, the installation position of the first cleaning unit 90 is not limited to an inner side than the fourth processing liquid recovering tank 74 in a radial direction as long as the position enables the first cleaning unit 90 to supply the cleaning liquid to the portion of the exhaust route forming member 66 that faces the exhaust route 77 to clean the corresponding portion. Similarly, the installation position of the second cleaning unit 92 is not limited to an inner side than the fourth processing liquid recovering tank 74 in a radial direction as long as the position enables the second cleaning unit 92 to supply the cleaning liquid to the portion of the exhaust route forming member 66 that faces the liquid processing chamber 51 to clean the corresponding portion.

Also, the exhaust duct 100 to which exhaust gas is sent from the first exhaust section 75 or the second exhaust section 76 may be provided with an exhaust duct cleaning mechanism configured to perform the cleaning of the inside of the exhaust duct 100. Hereinafter, the configuration of such an exhaust duct cleaning mechanism will be described with reference to FIGS. 4A and 4B. Here, FIG. 4A is a cross-sectional view illustrating the configuration of the exhaust duct provided in the liquid processing unit illustrated in FIG. 2, and FIG. 4B is a cross-sectional view taken along arrow A-A of the exhaust duct illustrated in FIG. 4A.

Figure 4A:
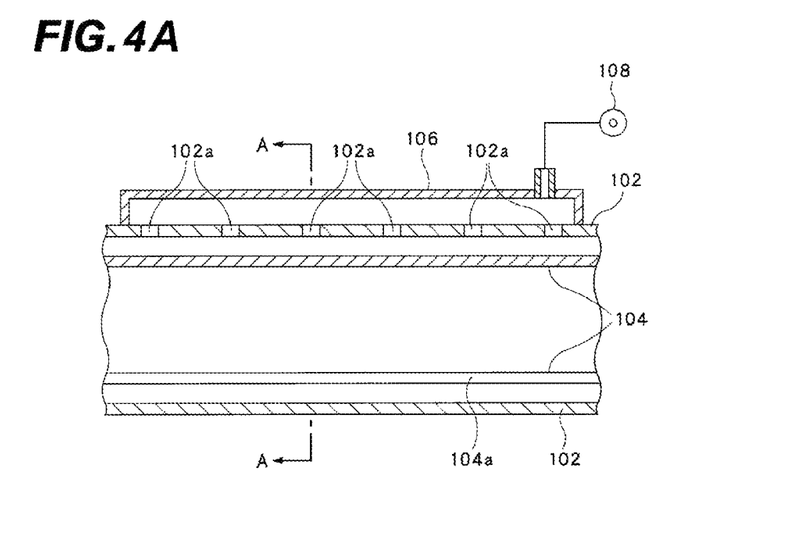
FIG. 4A is a cross-sectional view illustrating the configuration of an exhaust duct provided in the liquid processing unit illustrated in FIG. 2.
Figure 4B:
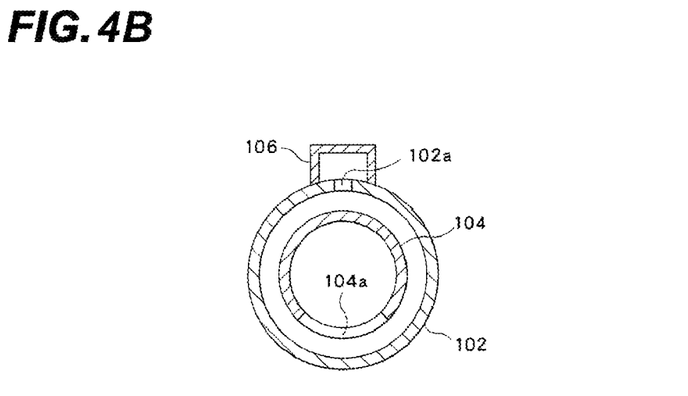
FIG. 4B is a cross-sectional view taken along arrow A-A of the exhaust duct illustrated in FIG. 4A.

As illustrated in FIGS. 4A and 4B, the exhaust duct 100 has a double-tube structure including an outer tube 102 and an inner tube 104. The inner tube 104 is configured to be rotated by a rotating mechanism (not illustrated). Also, an opening 104a is formed in the inner tube 104, and a space between the outer tube 102 and the inner tube 104 is adapted to be communicated with a space within the inner tube 104 through the opening 104a. Also, a cleaning unit 106 is provided on the outer circumferential surface of the outer tube 102, and a cleaning liquid is supplied to the space between the outer tube 102 and the inner tube 104 by the cleaning unit 106. More specifically, the cleaning unit 106 is connected to a cleaning liquid supply source 108, and the cleaning liquid is adapted to be supplied into the cleaning unit 106 by the cleaning liquid supply source 108. Also, an opening 102a is formed in the outer tube 102, and the cleaning liquid is supplied into the outer tube 102 from the cleaning unit 106 through the opening 102a. Thus, when the cleaning of the exhaust duct 100 is performed, the cleaning liquid is supplied into the outer tube 102 from the cleaning unit 106 via the opening 102a, and thus sent into the inner tube 104 via the opening 104a. Thus, it is possible to thoroughly clean the inner circumferential wall of the outer tube 102 and the inner circumferential wall and the outer circumferential wall of the inner tube 104 in the exhaust duct 100.

Figure 5:
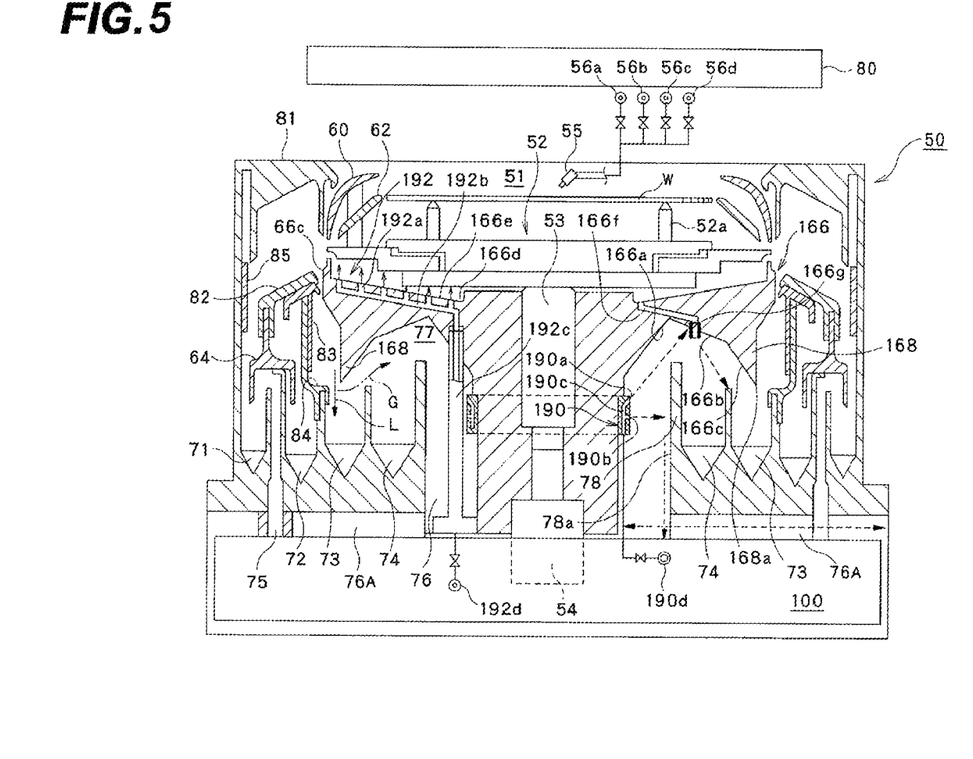
FIG. 5 is a configuration view illustrating the configuration of a liquid processing unit according to another exemplary embodiment.

Hereinafter, a second exemplary embodiment will be described with reference to FIG. 5. Hereinafter, descriptions will be made on a difference between the second exemplary embodiment and the first exemplary embodiment as illustrated in FIG. 2. In FIG. 5 illustrating the second exemplary embodiment, the same elements as those in FIG. 2 illustrating the first exemplary embodiment are given the same reference numerals and the redundant descriptions thereof will be omitted.

In the second exemplary embodiment, a first cleaning unit 190 is provided instead of the first cleaning unit 90 in the first exemplary embodiment. The first cleaning unit 190 is disposed in an area at an inner side than the exhaust route 77 in a radial direction, specifically, within the second exhaust section 76, as in the first exemplary embodiment. The first cleaning unit 190 is formed as a nozzle body of a hollow ring shape, and includes a plurality of (e.g., 90) first ejection holes 190a, and a plurality of (e.g., 30) second ejection holes 190b. The first ejection holes 190a are provided at regular intervals along the circumferential direction, and the second ejection holes 190b are also provided at regular intervals along the circumferential direction. Within the first cleaning unit 190, a flow path 190c that extends along the circumference is provided. The flow path 190c is connected to a cleaning liquid supply source 190d through an opening/closing valve. A cleaning liquid is ejected from the first ejection holes 190a and the second ejection holes 190b by being supplied to the first cleaning unit 190 from the cleaning liquid supply source 190d. The first cleaning unit 190 of the second exemplary embodiment is configured to linearly inject rather than to spray droplets (binary fluid) like the first cleaning unit 90 of the first exemplary embodiment.

Also, in the second exemplary embodiment, an exhaust route forming member 166 is provided instead of the exhaust route forming member 66 of the first exemplary embodiment. At the bottom surface side of the exhaust route forming member 166, a guide protrusion 168 is provided, in which the guide protrusion 168 protrudes downwardly toward the third processing liquid recovering tank 73. The guide protrusion 168 induces a liquid component included in a gas-liquid multiphase flow (see the arrow L in FIG. 5) to the third processing liquid recovering tank 73 below the guide protrusion 168, and guides a gas component (exhaust gas) (see the arrow G in FIG. 5) to the downstream side of the exhaust route 77 (radially inner side) as in the first guide plate 68 of the first exemplary embodiment. An area of the bottom surface of the exhaust route forming member 166 at the inner side than the lower end 168a of the guide protrusion 168 in a radial direction includes a ring-shaped first circumferential surface 166a, a ring-shaped second circumferential surface 166b connected to the outside of the first circumferential surface 166a, and a ring shaped third circumferential surface 166c connected to the outside of the second circumferential surface 166b. The first circumferential surface 166a has a slope such that its height increases toward the outer side in a radial direction, the second circumferential surface 166b and the third circumferential surface 166c have a slope such that the heights thereof decrease toward the outer side in a radial direction, and the gradient of the third circumferential surface 166c is greater than that of the second circumferential surface 166b.

The first ejection holes 190a of the first cleaning unit 190 eject the cleaning liquid radially outwards and also slantly upwards (see the dashed line arrow extending from the first ejection holes 190a in FIG. 5). The cleaning liquid ejected from the first ejection holes 190a collides with the second circumferential surface 166b, e.g., with the inner circumferential edge area of the second circumferential surface 166b. The cleaning liquid from the first ejection holes 190a which has collided with the second circumferential surface 166b flows as follows. (1) A part of the cleaning liquid is re-bounced from the second circumferential surface 166b and scattered toward the third processing liquid recovering tank 73 and the fourth processing liquid recovering tank 74 (see the dashed line arrow in FIG. 5), (2) another part flows radially outwardly along the second circumferential surface 166b, and along the third circumferential surface 166c, and drops into the third processing liquid recovering tank 73 from the lower end 168a of the guide protrusion 168, and (3) the other part (in a case where the flow rate of the cleaning liquid is sufficiently large) is also introduced onto the first circumferential surface 166a and flows radially inwardly on the first circumferential surface 166a. Particularly, the flow of (2) is achieved since, in the bottom surface of the exhaust route forming member 166, only a section extending from the collision position on the second circumferential surface 166b of the cleaning liquid ejected from the first ejection holes 190a to the lower end 168a of the guide protrusion 168 is slanted such that the height of the section decreases toward the outer side in a radial direction, and no downward protrusion which is likely to obstruct the flow of (2) exists in the section. Also, since the slope of the third circumferential surface 166c is steeper than that of the second circumferential surface 166b, the cleaning liquid certainly reaches the lower end 168a of the guide protrusion 168. Also, the second circumferential surface 166b and the third circumferential surface 166c may be a single continuous circumferential surface having the same slope angle.

As described above, according to the second exemplary embodiment, a wider area may be cleaned by the cleaning liquid ejected from the first ejection holes 190a owing to the cleaning liquid ejection aspect of the first ejection holes 190a of the first cleaning unit 190 and the shape of the bottom surface of the exhaust route forming member 166. In the first exemplary embodiment, it is difficult to cause the cleaning liquid ejected from the first cleaning unit 90 to reach the inside of the concave space interposed between the first guide plate 68 and the second guide plate 69. Thus, when crystals are deposited on the surfaces of the first guide plate 68 and the second guide plate 69 that face the concave space, the crystals may not be sufficiently removed. However, in the second exemplary embodiment, the cleaning liquid spreads over the entire area at the inner side than the lower end 168a of the guide protrusion 168 of the bottom surface of the exhaust route forming member 166. Thus, even if the crystals are deposited at the bottom surface side of the exhaust route forming member 166, they may be certainly removed.

The second ejection holes 190b of the first cleaning unit 190 are provided to eject the cleaning liquid radially outwards and also in the horizontal direction, and ejects the cleaning liquid toward an inner circumferential surface 78a of a wall body 78 that partitions the second exhaust section 76 and the fourth processing liquid recovering tank 74 from each other. The cleaning liquid from the second ejection holes 190b which has collided with the inner circumferential surface 78a flows down along the inner circumferential surface 78a (see the dashed line arrow in FIG. 5), and flows within an exhaust passage 76A communicated with the second exhaust section 76 provided below the first to fourth processing liquid recovering tanks 71 to 74 (see the dashed line arrow in FIG. 5), thereby cleaning the inside of the exhaust passage 76A. In the first exemplary embodiment, when the crystals are deposited within the exhaust passage 76A, the crystals may not be sufficiently removed. However, in the second exemplary embodiment, the crystals within the exhaust passage 76A may be certainly removed. Also, when the flow rate of the cleaning liquid is sufficiently large, the cleaning liquid from the second ejection holes 190b, which has collided with the inner circumferential surface 78a, may reach the wall surface that faces the inner circumferential surface 78a, thereby cleaning the wall surface as well. Also, at the time of cleaning, a relatively large amount of the cleaning liquid is introduced into the exhaust passage 76A. Thus, it is desirable to provide a suitable gas-liquid separation means at the downstream side of the exhaust passage 76A.

Also, in the second exemplary embodiment, a second cleaning unit 192 is provided instead of the second cleaning unit 92 in the first exemplary embodiment. The second cleaning unit 192 includes a plurality of ejection holes 192a provided at different positions in the radial direction. In the illustrated example, the plurality of ejection holes 192a are arranged in a straight line in the radial direction. Also, the plurality of ejection holes 192a are provided in the exhaust route forming member 166, and opened at the top surface of the exhaust route forming member 166. Within the exhaust route forming member 166, a flow path 192b extends in the radial direction of the exhaust route forming member 166, and the flow path 192b is connected to the plurality of ejection holes 192a. The flow path 192b is connected to a cleaning liquid supply source 192d via a supply tube 192c vertically extending within the second exhaust section 76, and an opening/closing valve.

At the top surface of the exhaust route forming member 166, a recess 166d is provided. At the bottom surface 166e of the recess 166d, the plurality of ejection holes 192a are opened. The bottom surface 166e has a slope such that the height of the bottom surface decreases toward the inside in a radial direction. Within the exhaust route forming member 166, at least one drain path 166f is formed and the top end of the drain path 166f is opened at an area of the inside end of the bottom surface 166e in a radial direction. The lower end of the drain path 166f is opened above the fourth processing liquid recovering tank 74, and a pipe 166g is inserted in the opening. The lower end of the pipe 166g is positioned at a lower side than the second circumferential surface 166b. Thus, the liquid that is discharged through the drain path 166f certainly drops into the fourth processing liquid recovering tank 74.

In the second exemplary embodiment, while the substrate holding unit 52 is being rotated, the cleaning liquid is upwardly ejected from the plurality of ejection holes 192a (see the dashed line arrow extending from the ejection holes 192a in FIG. 5). Thus, a wide area in the radial direction of the bottom surface of the substrate holding unit 52 may be cleaned by the cleaning liquid. That is, according to the second exemplary embodiment, the crystals deposited on the bottom surface of the substrate holding unit 52 may be removed more certainly as compared to the first exemplary embodiment. Also, the cleaning liquid that has collided with the bottom surface of the substrate holding unit 52 drops to the top surface of the exhaust route forming member 166, and radially inwardly flows down on the bottom surface 166e of the recess 166d, thereby being discharged from the recess 166d through the drain path 166f. Thus, the top surface of the exhaust route forming member 166 may also be cleaned. Also, since the substrate holding unit 52 is rotated during the cleaning, the cleaning liquid drops thoroughly over the entire area in the radial direction of the top surface of the exhaust route forming member 166. Thus, although the second cleaning unit 192 is provided at only one portion in the radial direction, the top surface of the exhaust route forming member 166 may be uniformly cleaned. Naturally, it is also possible to provide a plurality of second cleaning units 192 at different positions in the radial direction.

Also, in the second exemplary embodiment, the first cleaning unit 190 is a single nozzle that includes the plurality of first ejection holes 190a and the plurality of second ejection holes 190b, but is not limited thereto. A nozzle including the plurality of first ejection holes 190a and another nozzle including the plurality of second ejection holes 190b may be separately provided.

From the foregoing, it will be appreciated that various embodiments of the present disclosure have been described herein for purposes of illustration, and that various modifications may be made without departing from the scope and spirit of the present disclosure. Accordingly, the various embodiments disclosed herein are not intended to be limiting, with the true scope and spirit being indicated by the following claims.

What is claimed is:

1. A liquid processing apparatus comprising:
   a substrate holding unit configured to hold a substrate horizontally;
   a substrate rotating mechanism configured to rotate the substrate holding unit;
   a processing liquid supply unit configured to supply a processing liquid to the substrate held by the substrate holding unit;
   a guide cup provided to surround the substrate holding unit;
   a drain section configured to recover the processing liquid supplied to the substrate;
   an exhaust section provided in vicinity of the drain section and configured to exhaust the surrounding atmosphere of the substrate held by the substrate holding unit;
   an exhaust route forming member provided between a first area configured to process the substrate held by the substrate holding unit with the processing liquid and a second area in which the drain section and the exhaust section are provided, a gap being provided between the exhaust route forming member and the guide cup, and an exhaust route reaching the exhaust section being formed by the guide cup and the exhaust route forming member;

a first cleaning unit configured to supply a cleaning liquid to the exhaust route forming member at a second area side; and a second cleaning unit configured to supply the cleaning liquid to the exhaust route forming member at a first area side, wherein the exhaust route forming member is formed with a recess at the first area side and provided with a through hole at a bottom surface of the recess, the second cleaning unit supplies the cleaning liquid to a top surface side of the exhaust route forming member and to a portion of the substrate holding unit that faces the exhaust route forming member, and the cleaning liquid supplied toward the substrate holding unit is sent to the drain section via the through hole of the exhaust route forming member.

2. The liquid processing apparatus of claim 1, wherein the first cleaning unit is a nozzle configured to supply the cleaning liquid in a droplet state.

3. The liquid processing apparatus of claim 1, wherein the first cleaning unit is configured to supply the cleaning liquid to at least a portion of the exhaust route forming member at an inner side than the drain section in a radial direction.

4. The liquid processing apparatus of claim 1, wherein the exhaust route forming member is provided with a guide plate which downwardly extends from the exhaust route forming member, and the first cleaning unit is configured to supply the cleaning liquid to at least a portion at a downstream side of the guide plate in an exhaust direction of the exhaust route.

5. The liquid processing apparatus of claim 1, wherein the first cleaning unit is disposed at an inner side than the drain section in a radial direction.

6. The liquid processing apparatus of claim 1, wherein the first cleaning unit includes a nozzle provided within the second area disposed at an inner side than the drain section in a radial direction and including a plurality of first ejection holes arranged at intervals in a circumferential direction, and each of the first ejection holes ejects the cleaning liquid radially outwards and slantly upwards, toward a bottom surface of the exhaust route forming member.

7. The liquid processing apparatus of claim 6, wherein a guide protrusion protruding toward the drain section is provided at an outer peripheral portion of the bottom surface of the exhaust route forming member, the guide protrusion is configured to guide a liquid included in a gas-liquid multiphase flow that flows down from the first area toward the drain section, and to guide gas included in the gas-liquid multiphase flow to an inner side than the guide protrusion of the exhaust route in a radial direction, and in the bottom surface of the exhaust route forming member, a section extending from a cleaning liquid collision position to the guide protrusion is formed in a slope of which the height decreases toward the radial outside, the cleaning liquid collision position being a position where the cleaning liquid ejected from each of the first ejection holes collides.

8. The liquid processing apparatus of claim 6, wherein the first cleaning unit includes a nozzle provided within the second area which is at an inner side than the drain section in a radial direction and formed with a plurality of second ejection holes arranged at intervals in a circumferential direction, and each of the second ejection holes supplies the cleaning liquid toward a wall body that partitions the drain section.

9. The liquid processing apparatus of claim 1, wherein the second cleaning unit includes a plurality of ejection holes provided at different positions in a radial direction of the exhaust route forming member.

10. The liquid processing apparatus of claim 1, wherein the second cleaning unit is disposed at an inner side than the drain section in a radial direction.

* * * * *